United States Patent
Elam et al.

(10) Patent No.: US 7,713,907 B2
(45) Date of Patent: May 11, 2010

(54) METHOD OF PREPARING SIZE-SELECTED METAL CLUSTERS

(75) Inventors: Jeffrey W. Elam, Elmhurst, IL (US); Michael J. Pellin, Naperville, IL (US); Peter C. Stair, Northbrook, IL (US)

(73) Assignee: UChicago Argonne, LLC, Chicago, IL (US)

( * ) Notice: Subject to any disclaimer, the term of this patent is extended or adjusted under 35 U.S.C. 154(b) by 345 days.

(21) Appl. No.: 11/714,087

(22) Filed: Mar. 5, 2007

(65) Prior Publication Data

US 2007/0265159 A1    Nov. 15, 2007

Related U.S. Application Data

(60) Provisional application No. 60/779,619, filed on Mar. 6, 2006.

(51) Int. Cl.
  *B01J 23/00*    (2006.01)
  *B01J 21/00*    (2006.01)
  *B01J 20/00*    (2006.01)

(52) U.S. Cl. .................. 502/263; 502/243; 502/247; 502/261; 502/262; 502/326; 502/327; 502/330; 502/332; 502/333; 502/334; 502/339; 502/344; 502/347; 502/348; 502/350; 502/351; 502/353; 502/354; 502/355; 502/407; 502/415; 502/439

(58) Field of Classification Search .................. 502/100, 502/232, 300, 326, 339, 344, 345, 347, 350, 502/243, 247, 261–263, 330, 332–334, 348, 502/351, 353–355, 407, 415, 439, 327
See application file for complete search history.

(56) References Cited

U.S. PATENT DOCUMENTS

| | | | | |
|---|---|---|---|---|
| 5,098,516 A * | 3/1992 | Norman et al. | ............... | 216/78 |
| 5,316,796 A * | 5/1994 | Awaya et al. | ............... | 427/252 |
| 5,395,650 A * | 3/1995 | Holl et al. | ............... | 427/250 |
| RE36,330 E * | 10/1999 | Ritscher et al. | ............. | 502/313 |
| 5,989,653 A * | 11/1999 | Chen et al. | ............... | 427/553 |
| 6,232,264 B1 * | 5/2001 | Lukehart et al. | ............. | 502/339 |
| 6,603,038 B1 * | 8/2003 | Hagemeyer et al. | ...... | 560/241.1 |
| 6,660,680 B1 * | 12/2003 | Hampden-Smith et al. | .. | 502/180 |
| 6,734,133 B1 * | 5/2004 | Weisbeck et al. | ........... | 502/119 |
| 6,913,789 B2 * | 7/2005 | Smalley et al. | ........... | 427/249.1 |
| 6,918,960 B2 * | 7/2005 | Li et al. | ........................ | 117/89 |
| 7,052,668 B2 * | 5/2006 | Smalley et al. | ........... | 423/447.3 |
| 7,135,159 B2 * | 11/2006 | Shaffer et al. | ............. | 423/447.3 |
| 7,138,100 B2 * | 11/2006 | Smalley et al. | ........... | 423/447.3 |
| 7,202,596 B2 * | 4/2007 | Tang et al. | ................... | 313/495 |
| 7,273,814 B2 * | 9/2007 | Matsuda | ..................... | 438/680 |
| 7,285,308 B2 * | 10/2007 | Hendrix et al. | ........... | 427/248.1 |
| 7,354,881 B2 * | 4/2008 | Resasco et al. | ............. | 502/185 |
| 7,507,687 B2 * | 3/2009 | Kodas et al. | ................. | 502/101 |
| 7,527,875 B2 * | 5/2009 | Mizuno et al. | .............. | 428/570 |
| 2002/0102193 A1 * | 8/2002 | Smalley et al. | .............. | 422/190 |
| 2002/0102194 A1 * | 8/2002 | Smalley et al. | .............. | 422/190 |

(Continued)

*Primary Examiner*—Cam N Nguyen
(74) *Attorney, Agent, or Firm*—Cherskov & Flaynik (57) ABSTRACT

The invention provides a method for depositing catalytic clusters on a surface, the method comprising confining the surface to a controlled atmosphere; contacting the surface with catalyst containing vapor for a first period of time; removing the vapor from the controlled atmosphere; and contacting the surface with a reducing agent for a second period of time so as to produce catalyst-containing nucleation sites.

23 Claims, 10 Drawing Sheets

SEM image of 6 nm size-selected Pt clusters with a density of 5×10¹¹/cm² deposited on Al₂O₃ surface using the ALD technique described in this disclosure.

U.S. PATENT DOCUMENTS

| | | |
|---|---|---|
| 2002/0107140 A1* | 8/2002 | Hampden-Smith et al. .. 502/185 |
| 2002/0132863 A1* | 9/2002 | Schlogl et al. ............... 518/713 |
| 2003/0013606 A1* | 1/2003 | Hampden-Smith et al. .. 502/180 |
| 2003/0100183 A1* | 5/2003 | Li et al. ...................... 438/681 |
| 2003/0130114 A1* | 7/2003 | Hampden-Smith et al. .. 502/180 |
| 2003/0181321 A1* | 9/2003 | Hampden-Smith et al. .. 502/180 |
| 2003/0187294 A1* | 10/2003 | Hagemeyer et al. ......... 560/241 |
| 2005/0221000 A1* | 10/2005 | Ikeda et al. ............... 427/248.1 |
| 2005/0238808 A1* | 10/2005 | Gatineau et al. .......... 427/248.1 |
| 2007/0148962 A1* | 6/2007 | Kauppinen et al. .......... 438/637 |

\* cited by examiner

Figure 1: SEM image of 6 nm size-selected Pd clusters with a density of 5×10¹¹ cm⁻² deposited on Al₂O₃ surface using the ALD technique described in this disclosure.

METHOD OF PREPARING SIZE-SELECTED METAL CLUSTERS

CLAIM FOR PRIORITY

This application is related to, and claims benefit of and priority from, Provisional Application No. 60/779,619 filed Mar. 6, 2006, which is incorporated herein by reference in its entirety.

CONTRACTUAL ORIGIN OF THE INVENTION

The United States Government has rights in this invention under Contract No. W-31-109-ENG-38 between the U.S. Department of Energy and the University of Chicago representing Argonne National Laboratory.

BACKGROUND OF THE INVENTION

1. Field of the Invention

The present invention relates to a method for forming metal clusters, and more particularly, the present invention relates to a method for controlling the size and density of catalytic clusters formed on a surface and a substrate having metal cluster formed on a surface thereof.

2. Background of the Invention

Metal clusters with diameters in the range of 1-10 nanometers ("nm") are extremely effective catalysts given that nearly all of the metal atoms comprising the cluster are present on the surface and therefore available to participate in catalytic reactions.

Metal clusters are difficult to prepare in mono-dispersed form having a narrow size distribution. This is particularly difficult when attempting to deposit the clusters on high surface area substrates which are necessary to support heterogeneous catalysts.

A traditional method for preparing mono-dispersed metal clusters is to use a molecular beam in which ionized metal clusters are size-selected using a quadrupole or electrostatic filtering element.

Metal clusters are also formed by evaporating or sputtering a thin metal film onto a surface and annealing the film such that the metal atoms coalesce to form particles or clusters. Both of the aforementioned techniques are only viable for deposition on flat (i.e., nonporous) surfaces.

Metal nanoparticles may also be created using solution based methods. However, the nanoparticles must still be dispersed on the high surface area support without agglomeration to create the heterogeneous catalyst. Moreover, metal nanoparticles fabricated in solution are typically coated with one or more mono-layers of stabilizing agents, such as polymers, to prevent aggregation of the metal particles, and these layers must be removed in order to use the particles as a catalyst.

Porous supports can be infiltrated with metal atoms using wet chemical or chemical vapor techniques followed by annealing, causing the atoms to aggregate into clusters. However, this method offers little control over particle size and density.

Atomic layer deposition ("ALD") produces conformal films of a variety of materials including some metals with exquisite thickness control by utilizing alternating reactions between gaseous precursor molecules and a solid surface to deposit material in a layer-by-layer fashion. However, attempts to deposit metal on oxide foundation substrates using ALD has met with limited success. This is due to the lack of metalorganic chemisorption on oxide terminated surfaces. J. Senkevich, et al, _Chem. Vapor Depos._ 8 (2002) 189.

A need exists in the art for a method for depositing catalytic clusters on porous surfaces, and particularly oxide surfaces. The method should enable the formation of clusters between 1 nm and 10 nm in diameter. The method should further enable the formation of clusters in a variety of cluster densities without increasing the size of the individual clusters. Conversely, the method should enable the formation of large clusters without a concomitant increase in the number of clusters.

SUMMARY OF THE INVENTION

It is an object of the present invention to provide a method for depositing metal clusters onto porous substrates that overcomes many of the disadvantages of the prior art.

Another object of the present invention is to provide methods for depositing catalytic material onto substrates. A feature of the invention is the ability to regulate the number of clusters deposited. Another feature of the invention is the ability to regulate the size of clusters deposited. An advantage of the invention is that catalytic efficiencies increase once an optimum cluster size and density is determined and then deposited onto a support substrate.

Yet another object of the present invention is to provide methods for depositing catalytic material onto porous substrates (i.e., substrates having surface areas between 10 square meters per gram ($m^2/g$) and 1000 $m^2/g$). A feature of the invention is that catalytic deposits ranging from about 1 nm to 10 nm in diameter are made. An advantage of the invention is that the clusters are deposited in a mono-dispersed form (i.e., uniform size) so as to facilitate production of heterogeneous catalysts, which are catalysts supported by a relatively inert foundation substrate. The method further allows for positioning different catalysts in close proximity to each other on the same foundation substrate.

Still another object of the present invention is to provide a method for depositing catalytic material on substrates in a predetermined pattern. A feature of the method is the ability to control cluster size independent of cluster number on the substrate. An advantage of the method is that catalytic efficiencies can be tuned to provide either higher numbers of catalytic surfaces of a certain size, larger surface areas for individual clusters at a given cluster density, or a combination of cluster size and density.

In brief, the invention provides a method for depositing catalytic clusters of the same size on a surface, the method comprising confining the surface to a controlled atmosphere; contacting the surface with catalyst containing vapor for a first period of time; removing the vapor from the controlled atmosphere; and contacting the surface with a reducing agent for a second period of time so as to produce catalyst-containing nucleation sites.

Another embodiment of the invention provides a substrate comprising at least one surface with a surface area between about 10 $m^2$/gram and 1000 $m^2$/gram; and a plurality of catalytic clusters of the same size deposited on the surface. The catalytic clusters are deposited on the surface using a method comprising confining the substrate to a controlled atmosphere and contacting the surface with catalyst containing vapor for a first predetermined period of time. The vapor is removed from the controlled atmosphere and the surface is contacted with a reducing agent for a second predetermined period of time, producing catalyst-containing nucleation sites. The surface is contacted with a second catalyst-containing vapor for a third predetermined period of time and the vapor is removed from the controlled atmosphere. The surface is contacted with a reducing agent for a fourth predetermined period of time, producing clusters (i.e. nucleation sites) containing the first and second catalysts.

DESCRIPTION OF THE DRAWING

These and other objects and advantages of the present invention will become readily apparent upon consideration of the following detailed description and attached drawing, wherein:

FIG. 2A-2B is a schematic depiction of a method for initiating catalytic cluster nucleation via temperature regulation and subsequently growing the cluster, in accordance with features of the invention;

FIG. 3A-3B is a schematic depiction of an alternative method for initiating catalytic cluster nucleation via flux regulation of reactants and subsequently growing the cluster sizes, in accordance with features of the present invention;

FIG. 4A-C is a schematic depiction of a method for preparing size selected, mixed-metal clusters based on reaction temperatures, growth cycle numbers and relative numbers of exposures to different metal-containing vapor species, in accordance with features of the invention;

FIG. 9A-9B is a flow diagram illustrating a method for depositing catalytic clusters on a surface of a substrate.

DETAILED DESCRIPTION OF THE INVENTION

Generally, this invention provides a procedure for producing catalytic centers on a substrate. Embodiments of the invention also provide a procedure for growing the size of catalytic clusters on a substrate. Specifically, this invention describes a method for preparing size-selected metal clusters by using atomic layer deposition (ALD) techniques that allow independent control over the cluster density and cluster size, and is applicable to both flat surfaces and high surface area support surfaces. Embodiments of the invented method enable tailoring cluster sizes for specific catalytic reactions, so as to provide selective oxidation of the constituents of the fluids to be treated with the catalyst.

Accurate tailoring of cluster size on a substrate in turn tailors the characteristics of reactant interactions with surfaces of the cluster. Larger clusters have different electronic, chemical and physical properties than do smaller clusters. Larger clusters, with their concomitant shrinking of border areas to adjacent clusters, result in steric hinderances of reactant moieties to catalytic surfaces. Such hinderances serve as means for tempering reaction rates.

Embodiments of the invented method are particularly applicable to forming clusters of a myriad of metals on flat surfaces as well as on high surface area supports. In one embodiment, the chemical reactions of the method terminate following the deposition of exactly one monolayer of adsorbed species so that the film thickness is easily controlled by the number of reaction cycles.

Figure 1:
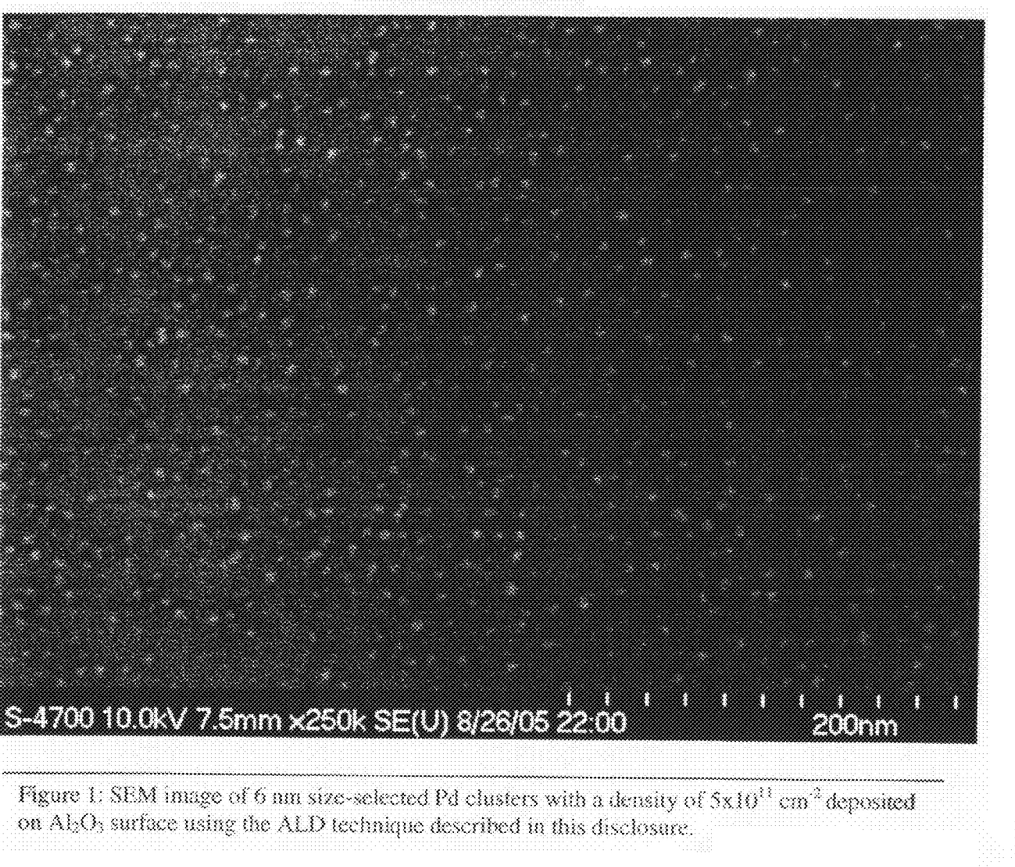
FIG. 1 is a photomicrograph of 6 nm sized metal clusters deposited on silicon substrate, in accordance with features of the present invention.

FIG. 1 depicts a scanning electron microscope image of homogeneously sized Pd clusters on an $Al_2O_3$ surface. The clusters are each 6 nanometers ("nm") in size. Typical cluster densities achieved using embodiments of the invention are between about $10^9$ to $10^{14}$ clusters per square centimeter. Typically, the density of the clusters is about $5 \times 10^{11}$ per square centimeter. The Pd clusters were prepared on a Si (100) surface that had been previously coated with $Al_2O_3$ using ALD. The thickness of the $Al_2O_3$ coating is inconsequential, as long as the coating has the characteristic of a bulk $Al_2O_3$ material. As such, coatings having thicknesses above 1 nanometer are suitable.

A salient feature of the invention is the production of discrete and independent catalytic centers on a foundation substrate such that the clusters are not in direct physical contact with each other. This feature optimizes reaction surface areas between each catalyst cluster and a fluid being treated by the catalyst. Spaces between the clusters can vary, but given an individual cluster size of between about 0.5 nanometers and 50 nanometers, spaces between the clusters can range from about 1 nm to 300 nm. Generally, spaces between clusters are provided to inhibit agglomeration of individual catalyst sites. Distances selected from between about 5 nm and 100 nm are most preferred. The final prepared surface resembles more of a stippling of individual reaction centers rather than a continuous film over the surface.

Reaction temperatures will vary depending on the reaction moieties utilized, and the density of the clusters desired. Generally, temperatures above the decomposition temperature of the metal-containing vapor and below its vaporization temperature are not suitable. As such, in the case of Pd deposition for example, suitable temperatures are above 50° C. but less than 230° C. Preferable Pd growth temperatures are found from between 100° C. and 200° C.

Figure 2:
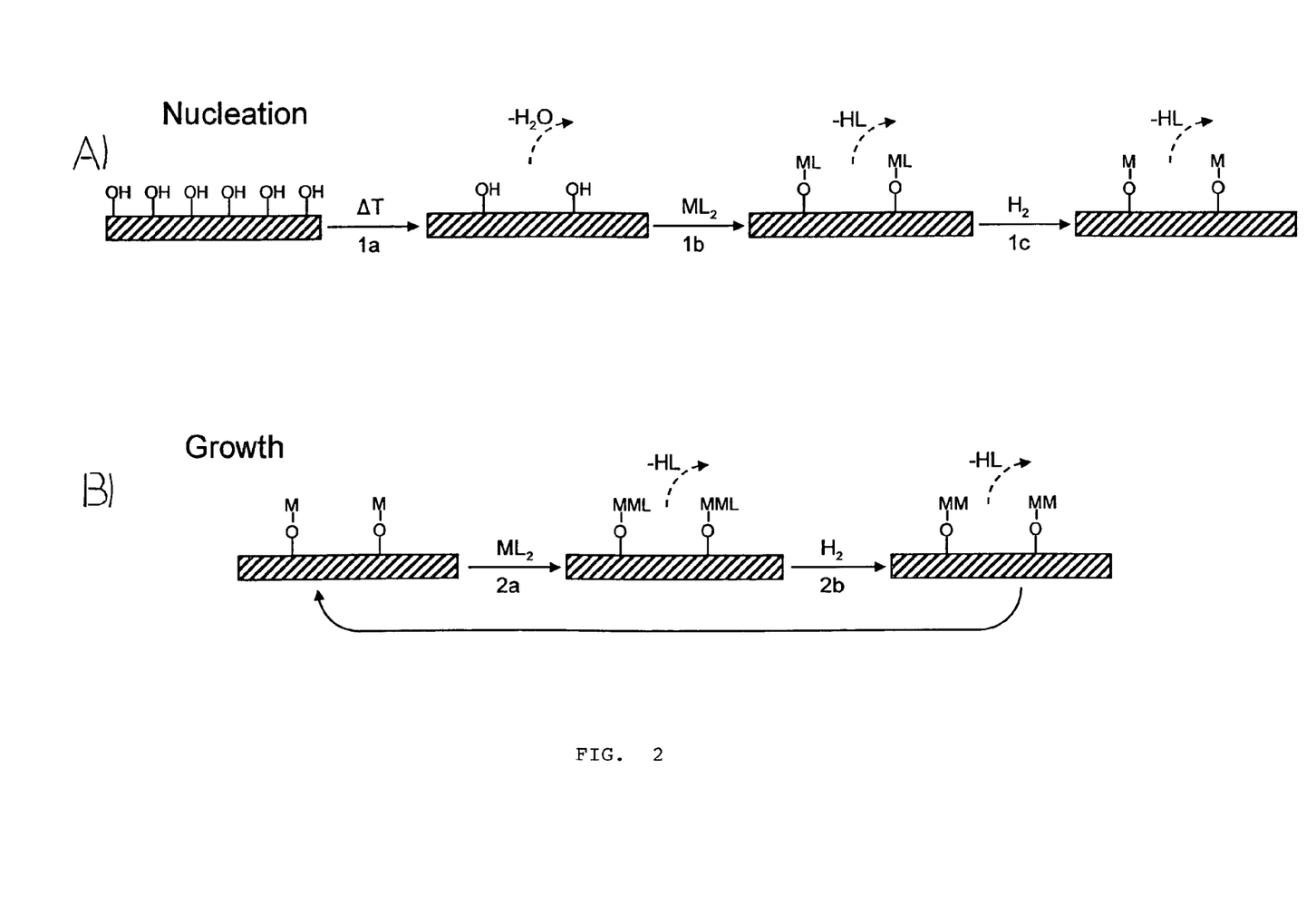

The inventors discovered that preheating or other pretreatment of the foundation substrate modifies moieties on the surface of the substrate which covalently or ionically interact with cluster metals. This surface modification results in modifying the density of cluster numbers on the surface. For example, and as depicted in FIG. 2A, fewer hydroxyl moieties exist on the surface of a foundation substrate if the surface is first exposed to temperatures ranging from 25° C. and 800° C., in controlled atmosphere. Instead, a condensation reaction occurs, whereby hydroxyl moieties (each of which normally accommodate a metal moiety) loose their hydrogens and combine with oxygen to form water. The remaining oxygen atom from one of the hydroxyl moieties interacts with the neighboring metal moiety to form a bridging oxygen moiety between the two metal moieties. Specifically, heating the alumina substrate in dry nitrogen to 100° C. prior to attachment of catalytic metal such as Vanadium via ALD resulted in a Vanadium oxide cluster density of approximately 10 clusters per square nanometer. When the temperature was increased to 450° C. prior to the Vanadium oxide ALD, a cluster density of approximately 5 clusters per square nanometer was achieved. The use of vanadium in this instance is illustrative only, inasmuch as deposition of other catalytic metals, as enumerated infra, will proceed similarly.

Figure 3:
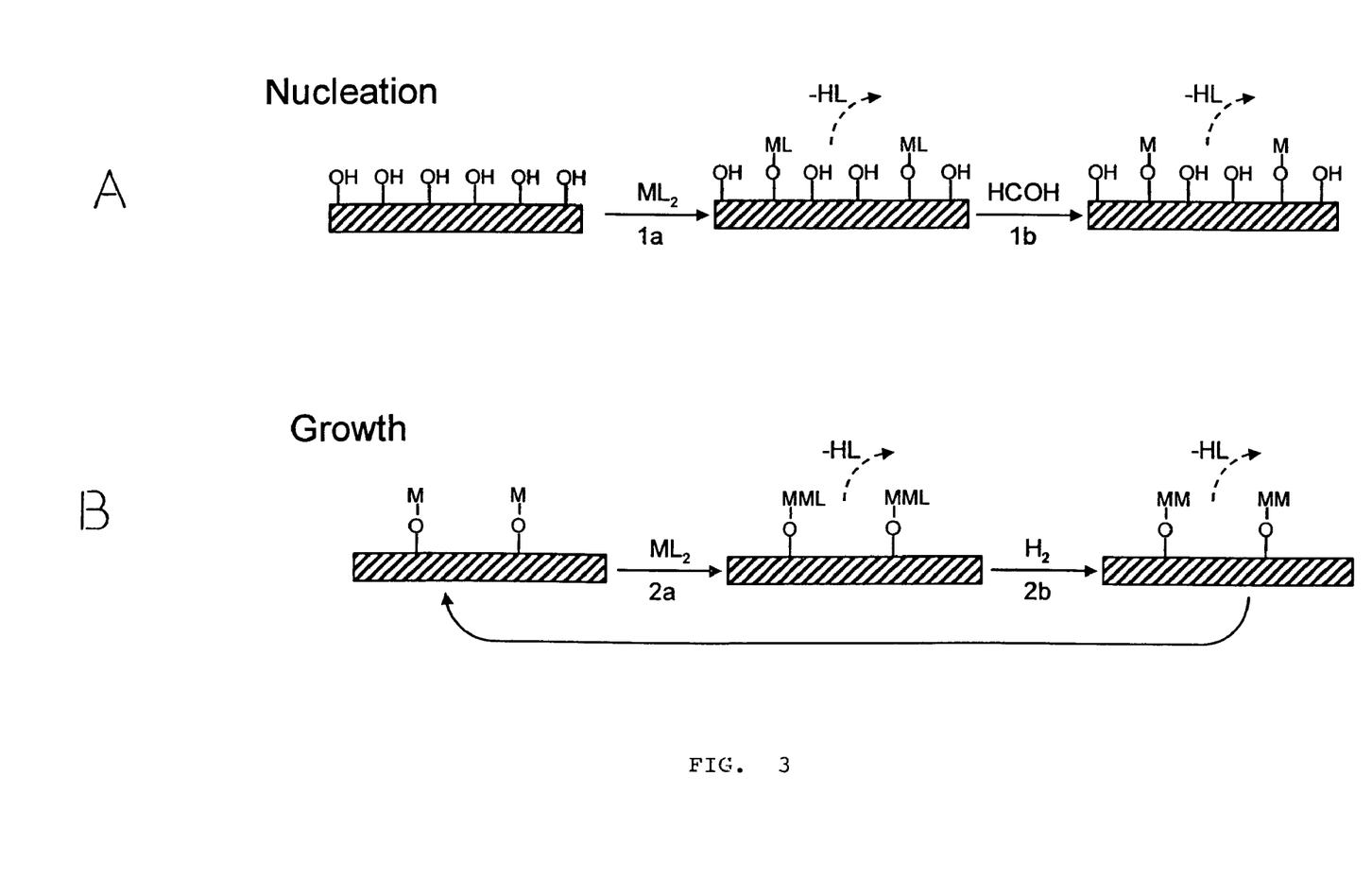

Surprisingly and unexpectedly, the inventors found that by starting the process with one ALD cycle of metal-containing vapor, the number density of nucleation sites is controlled, and so the number of metal clusters in a given area. The number density is controlled by the duration of the reactant exposures in this initial cycle, with longer metal-vapor and reducing agent exposure times producing a larger number of cluster nuclei. Subsequently, the size of these clusters is controlled using a controlled number of metal-vapor/reducing agent exposures. The inventors found that the number of exposures is directly proportional to the size of the clusters as depicted in FIG. 3B, but that the increased number of exposures does not initiate or nucleate any new clusters on the surface, also as depicted in FIG. 3B.

Cluster Formation Detail

A salient feature of the invention is the alternating application of metal-containing vapor and reducing agent to a substrate in a controlled atmosphere. A myriad of metals are suitable for deposition and dispersion with the invented method, including but not limited to metals that have a low tendency to oxidize. Suitable metals include noble metals generally. Low oxidation metals such as Pd, Pt, Rh, Ir, Ru, Re and combinations thereof are suitable.

Depending on the catalyst used, a myriad of vapors are utilized. For example, suitable palladium-containing vapors include, but are not limited to Palladium (II) acetylacetonate, Palladium (II) hexafluoroacetylacetonate (Pd(hfac)$_2$), Bis(2,2,6,6-tetramethyl-3,5-heptanedionato) palladium, and combinations thereof.

If platinum catalyst is being deposited, suitable metal-containing vapors include cyclopentadienyls, substituted pentadienyl precursors and beta diketonates. Suitable species of the aforementioned genuses of vapor include, but are not limited to, Platinum (II) acetylacetonate, Platinum (II) hexafluoroacetylacetonate, (Trimethyl)cyclopentadienylplatinum (IV), (Trimethyl)methylcyclopentadienylplatinum (IV), Tris(2,2,6,6-tetramethyl-3,5-heptanedionato)platinum, and combinations thereof.

If rhodium catalyst is being deposited, suitable metal-containing vapors include, but are not limited to, Rhodium (III) acetylacetonate, Rhodium (III) hexafluoroacetylacetonate, Tris(2,2,6,6-tetramethyl-3,5-heptanedionato) rhodium, and combinations thereof.

If ruthenium catalyst is being deposited, suitable metal-containing vapors include, but are not limited to, Bis(cyclopentadienyl) ruthenium, Bis(ethylcyclopentadienyl) ruthenium (II), Bis(pentamethylcyclopentadienyl) ruthenium, Ruthenium (III) acetylacetonate, Ruthenium (III) hexafluoroacetylacetonate, Tris(2,2,6,6-tetramethyl-3,5-heptanedionato) ruthenium (III), and combinations thereof.

If iridium catalyst is being deposited, suitable metal-containing vapors include, but are not limited to Iridium (III) acetylacetonate, Iridium (III) hexafluoroacetylacetonate, Tris (2,2,6,6-tetramethyl-3,5-heptanedionato) iridium, (Methylcyclopentadienyl)(1,5-cyclooctadiene) iridium (I), and combinations thereof.

Figure 4:
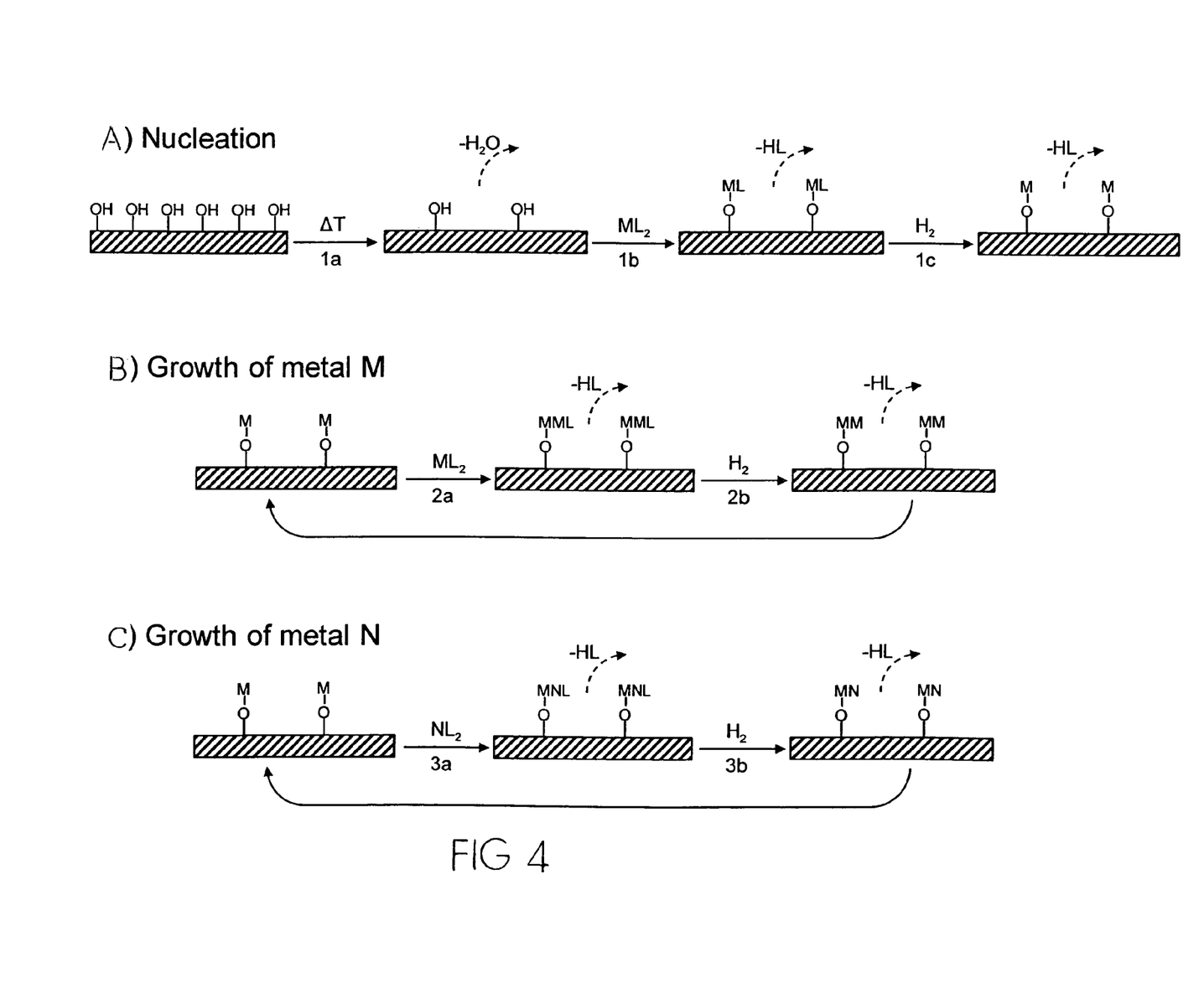

As depicted in FIG. 4, the invention provides for the serial (i.e. sequential) use of different metal vapors in instances where different catalytic centers on the same surface are desired. In such instances, the application of different metal vapors are interrupted with an application of reducing agent, the later serving as a means for terminating the metal deposition reaction related to exposure of the substrate to the previously provided metal vapor. Specifically, FIG. 4A shows initial heating of a substrate to reduce the number of potential surface-based nucleation sites prior to exposure to metal. Reducing agent (in this instance H$_2$) is provided to stop cluster growth of a first applied metal "M" as depicted in FIG. 4B. A second metal "N" is contacted with the first metal containing substrate so as to facilitate deposition of the second metal to the substrate and/or to the first metal cluster.

A variety of reducing agents or ligand-removing agents can be used in conjunction with the aforementioned metal-containing ALD precursors to prepare the size-selected metal clusters. These include H$_2$, hydrogen plasma, formaldehyde, alcohols such as methanol, ethanol and isopropanol, air, oxygen, oxygen plasma, and ozone.

Foundation Substrate Detail

Metal clusters are deposited on a substrate via atomic layer deposition (ALD). As discussed supra, the ALD bombards an underlying substrate, particularly an oxide, with alternating exposures to a metal-containing vapor (e.g., Palladium (II) hexafluoroacetylacetonate, or Pd(hfac)$_2$) and a reducing agent. Oxygen termini on a foundation substrate are particularly suitable so as to facilitate oxygen exchange between catalyst metal and the surface.

Suitable foundation substrates include but are not limited to silicon, glass, metal oxide surfaces (alumina, titania, silica, vanadia), metals, polymers, porous host matrices (aerogels, anodic aluminum oxide, silica gel, mesoporous silica). Oxides provide the high thermal and chemical stability required for metal deposition reactions. Oxides also maintain the high surface areas, discussed supra, under the desired reaction conditions. The combination of the predetermined reaction conditions and high surface area substrate provides a means for separating metal clusters from each other, thereby optimizing catalytic interaction between the deposited metal and reactants to be treated by the catalyst.

In addition, foundation substrates can be functionalized to have hydroxyl groups on the surface that allow subsequent attachment of metal nanoparticles. For example, first treating the substrate using a thin coating (1-10 nm) of ALD Al$_2$O$_3$ or other metal oxide material such as TiO$_2$, Nb$_2$O$_5$, or SiO$_2$ provides such functional moieties. Hydroxyl groups facilitate the chemistry for attaching a first layer of metal atoms to oxide surfaces. Controlling the density of hydroxyl groups controls the density of clusters.

The inventors observed nucleation on ALD treated Al$_2$O$_3$ surfaces, on glass and Si substrates that had been coated with a 1-10 nm ALD Al$_2$O$_3$ seed layer, and on mesoporous anodic aluminum oxide (AAO) membranes. Topography of the surfaces can vary from extremely dense (i.e., non porous) surfaces to surfaces defining cavities, channels, and crevices. The method is suitable to treat surfaces having an aspect ratio of pore length/diameter (L/d) ratio of between 1 L/d and $10^6$ L/d. Generally, substrates with a surface area of between 1 m$^2$/gram and $10^3$ m$^2$/gram are suitable.

Complete penetration of the Pd clusters onto very high aspect ratio (e.g. 1500 L/d) membranes was confirmed using cross sectional energy dispersive analysis of x-ray (EDAX) measurements.

Regarding the treatment of Pd surfaces for example, each ALD cycle comprised one exposure to Palladium (II) hexafluoroacetylacetonate (Pd(hfac)$_2$) followed by one exposure to the reducing agent (either formaldehyde or H$_2$) to deposit 0.2 Å (0.02 nm) of Pd. Either reducing agent was used to grow Pd clusters. However on Al$_2$O$_3$ surfaces, only the formaldehyde reducing agent is utilized to initiate nucleation (i.e. cluster formation).

A catalytic surface produced via the ALD method for producing size-selected Pd clusters is illustrated in the scanning electron microscope (SEM) image in FIG. 1. This image shows Pd clusters with a diameter of ~6 nm and a density of ~5×10$^{11}$ cm$^2$. These Pd clusters were prepared on a Si(100) surface previously coated with 2.6 nm Al$_2$O$_3$ using ALD. First, one ALD cycle for Pd nucleation was performed using Pd(hfac)$_2$/HCOH with 30 s exposures at 200° C. Next, the Pd clusters were grown using 100 Pd ALD cycles using 2 s Pd(hfac)$_2$ exposures and 1 s H$_2$ exposures at 100° C.

Detail of Pd Clusters on Al$_2$O$_3$ Substrate

The nucleation of Pd on Al$_2$O$_3$ occurred by first depositing a 10 nm Al$_2$O$_3$ ALD buffer layer on the in situ quartz crystal microbalance (QCM) using alternating TMA/H$_2$O exposures and subsequently depositing Pd using Pd(hfac)$_2$ and various reducing agents. Generally, substances providing readily extractible hydrogen atoms are suitable reducing agents. For example, formaldehyde is a preferred reducing agent given that the relatively high dipole moment of its carbonyl group provides H atoms for metal reduction, and without the need for a catalytic surface or higher temperatures. In situations where catalysts and/or high temperatures are to be avoided as a means to liberate hydrogen atoms, substances whereby hydrogen is directly attached to carbonyl carbons are particularly viable reducing agents.

Notwithstanding the foregoing, suitable reducing agents include, but are not limited to, H$_2$, methanol, ethanol, isopropanol, acetone, trimethyl aluminum (TMA), formalin, formic acid, and hydrogen plasma. Cluster growth was observed at between 100 to 200° C.

Figure 9A:
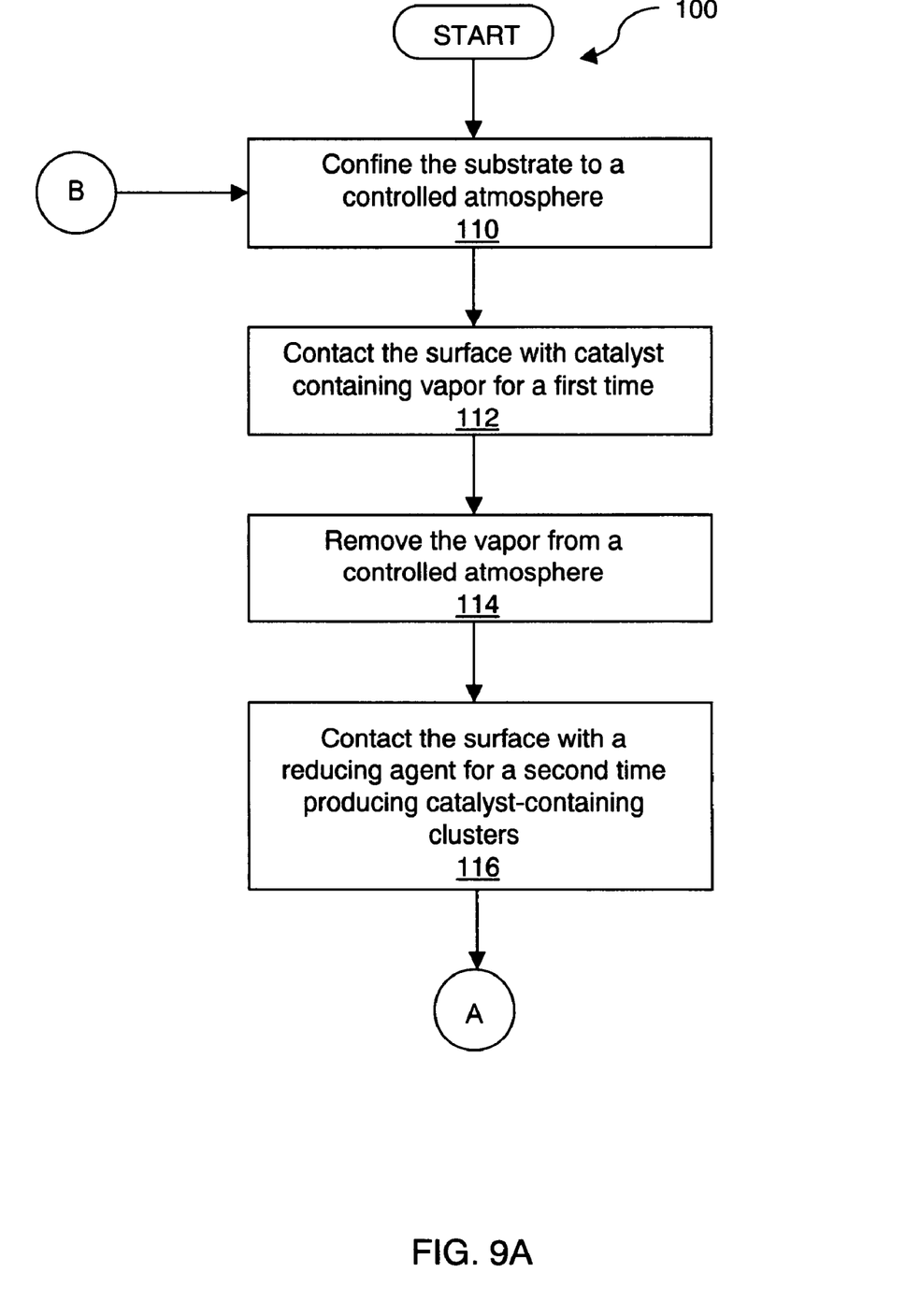
Figure 9B:
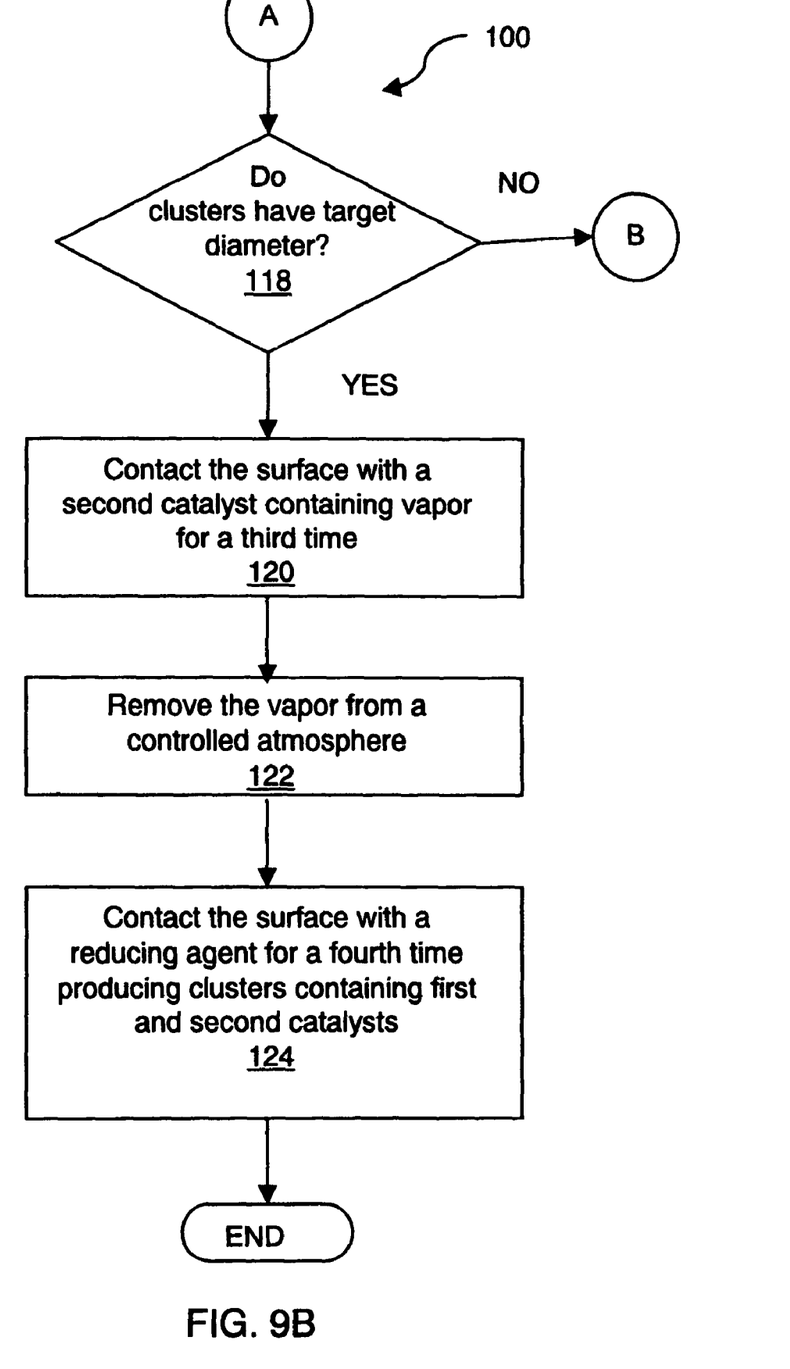

Turning to FIG. 9A-9B, a flow diagram is depicted illustrating a method, generally designated 100, for depositing catalytic clusters on a surface of a substrate, the surface having a surface area between about 10 m$^2$/gram and 1000 m$^2$/gram for example. Method 100 comprises confining at least one surface of the substrate to a controlled atmosphere as illustrated by block 110. The surface is contacted with a catalyst containing vapor for a first predetermined period of time (between 1 and 1000 seconds for example) as illustrated by block 112, depending on the porosity of the substrate to be coated. (The lower the porosity, the less time required.) The vapor is removed from the controlled atmosphere as illustrated by block 114. The at least one surface is contacted with a reducing agent for a second predetermined period of time (between 1 and 1000 seconds for example), producing catalyst-containing nucleation sites as illustrated by block 116.

As illustrated, method 100 determines if the clusters exhibit a predetermined target diameter, decision/diamond 118. If the clusters do not exhibit a predetermined target diameter, method 100 repeats (i.e., returns to block 110, repeating the steps in blocks 110, 112, 114 and 116) until the clusters (i.e., nucleation sites) exhibit a predetermined target diameter.

FIG. 9A-9B further illustrates method 100 contacting the surface with a second catalyst-containing vapor for a third predetermined period of time (between 1 and 1000 seconds for example) as illustrated by block 120. The vapor is from the controlled atmosphere, and the surface is contacted with a reducing agent for a fourth predetermined period of time (between 1 and 1000 seconds for example), producing clusters (i.e., nucleation sites) containing first and second catalysts as illustrated by blocks 122 and 124.

Example 1

Pd Cluster Density Detail

Figure 5:
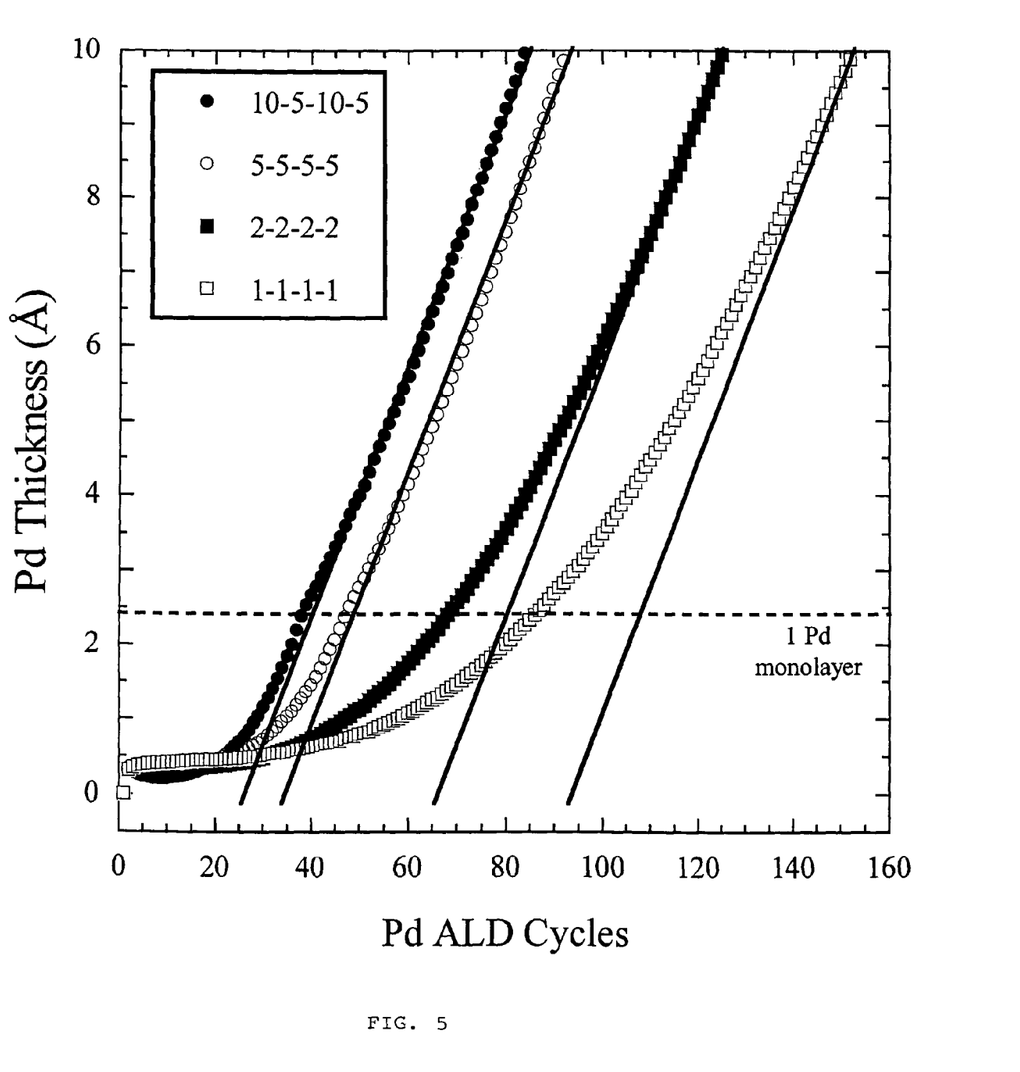
FIG. 5 is a graph depicting the effect of different reaction exposure time sequences on the growth rate of cluster size on a surface, in accordance with features of the present invention.

The influence of the Pd ALD timing sequence on Pd cluster and film growth rate was examined by first depositing a 10 nm Al$_2$O$_3$ ALD buffer layer on the QCM and subsequently depositing Pd using Pd(hfac)$_2$/formalin with the different timing sequences given in FIG. 5. For these experiments, the timing sequence was adjusted to be $1_{t1}$-$1_{t2}$-$1_{t3}$-$1_{t4}$ seconds following the deposition of 1 Pd monolayer. The timing sequence corresponds to first an exposure time (t1) for the metal containing vapor, second a purge time (t2) whereby the metal vapor is purged or otherwise evacuated from the reaction chamber, third an exposure time (t3) for the reducing agent, and fourth a time (t4) for purging the reducing agent from the reaction chamber. The QCM measurements in FIG. 4 assume a Pd density of 12.0 g/cm$^3$. FIG. 5 reveals that using the 1-1-1-1 s timing sequence, the Pd growth rate is lower initially on the Al$_2$O$_3$ surface and then gradually increases to reach the steady-state growth rate of 0.21 Å/cycle following ~140 Pd ALD cycles. Approximately 100 cycles are needed to deposit 1 Pd monolayer using the 1-1-1-1 s timing sequence. The much lower initial growth rate may result from the relatively slow reaction of the Pd(hfac)$_2$ and formalin precursors on the Al$_2$O$_3$ surface as compared to the Pd surface. This ~140 cycle nucleation period may produce rough or discontinuous films due to 3-dimensional island growth.

Pd ALD can be accelerated using larger initial Pd(hfac)$_2$ and formalin exposures. Using the 10-5-10-5 sequence, the steady-state growth rate is achieved in only 30 cycles and 35 cycles are required to deposit 1 Pd monolayer. The Pd nucleation was not greatly accelerated by increasing just the Pd(hfac)$_2$ or the formalin exposure alone (e.g.: 10-5-1-1 s or 1-1-10-5 s), indicating that the reactivity of both precursors is diminished on the Al$_2$O$_3$ surface as compared with the Pd surface. The faster nucleation observed using longer initial Pd ALD exposures results, in part, from a higher Pd growth rate.

Example 2

Pd Cluster Size Detail

The nucleation technique allows Pd to be deposited on these surfaces using atomic layer control after the deposition of a thin ALD Al$_2$O$_3$ seed layer. In addition, formalin allows Pd films to be deposited directly on other oxide surfaces without the need for an Al$_2$O$_3$ seed layer. H$_2$ is effective for Pd ALD once the Pd film has nucleated using formalin. One embodiment of the method comprises first nucleating the Pd growth using formalin, and then to switch to H$_2$ for the remaining film growth.

Figure 6:
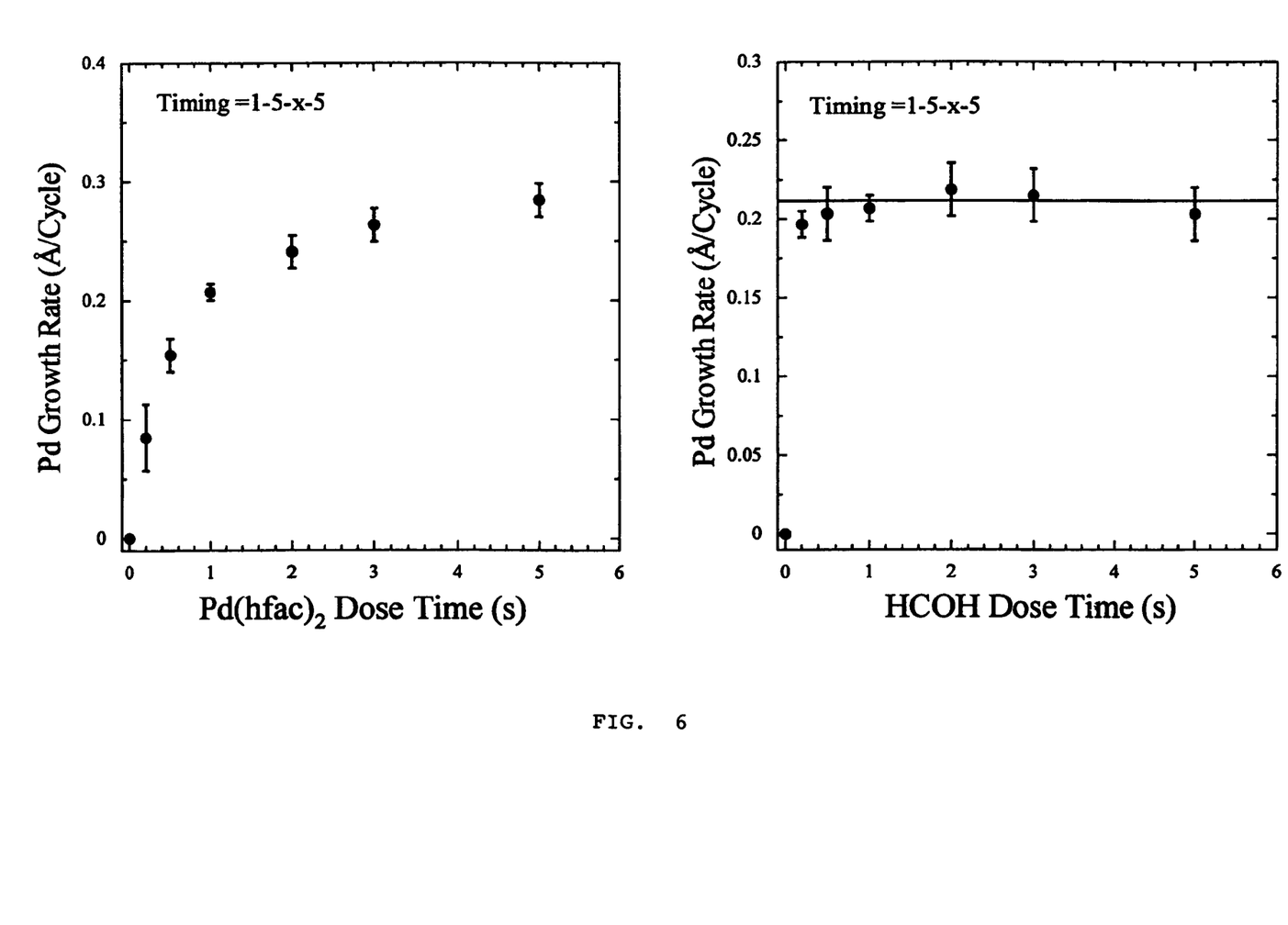
FIG. 6 is a graph showing growth of Pd cluster growth during various phases of reactant exposure, in accordance with features of the present invention.

Following the nucleation studies, the QCM was used to determine the optimum timing sequence for Pd ALD. As shown in FIG. 6a, the Pd ALD growth rate increases rapidly with Pd(hfac)$_2$ exposure time and reaches 0.21 Å/cycle at t1=1 s. The Pd growth rate continues to increase slowly for t1>1 s and achieves 0.28 Å/cycle at t1=5 s. This gradual saturation reflects a decreasing Pd(hfac)$_2$ reactivity with increasing surface coverage. In contrast to the Pd(hfac)$_2$ results, the Pd growth rate is completely saturated for formalin exposures exceeding 0.5 s (FIG. 6b). The Pd ALD growth rate changes very little with increasing Pd(hfac)$_2$ and formalin purge times greater than 0.5 seconds. For the remaining studies, the timing sequence 1-1-1-1 s was used for the Pd ALD. Although this timing sequence is not completely saturated in the Pd(hfac)$_2$ exposures, it optimizes the Pd deposition rate in light of the relatively low ALD Pd growth rate of ~0.2 Å/cycle.

Figure 7:
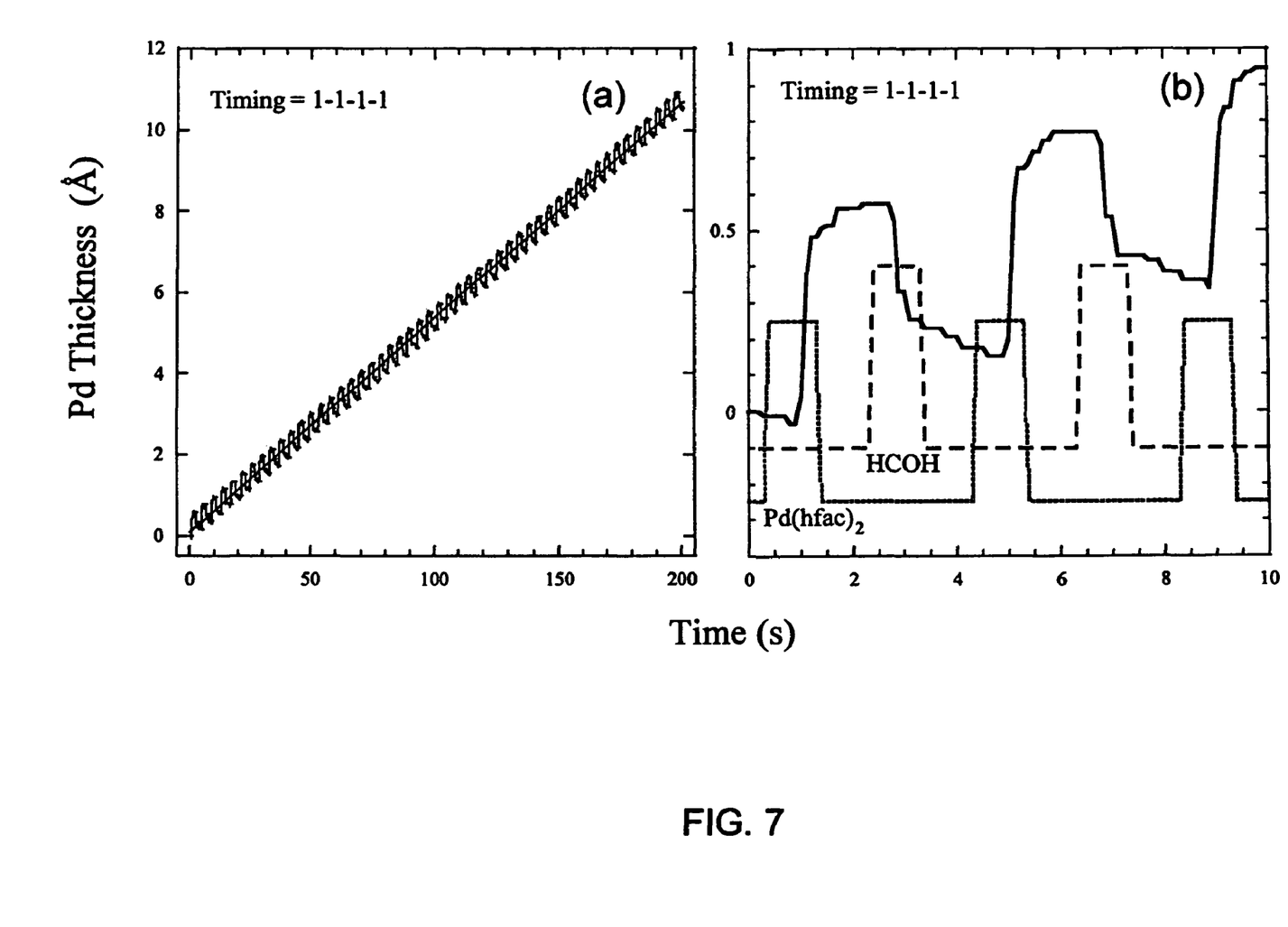
FIG. 7a is a graph showing Pd ALD measured by quartz crystal microbalance showing linear growth at 0.021 nm/cycle.
FIG. 7b is an expanded view of the Pd ALD step showing thickness increase during each metal-containing vapor exposure and thickness decrease during reducing agent exposure.

FIG. 7a shows QCM data obtained during Pd ALD using the 1-1-1-1 s timing sequence for 50 Pd ALD cycles on an already-deposited ALD Pd surface. The data shows highly linear growth at 0.21 Å/cycle. An expanded view of this data is shown in FIG. 7b to illustrating the QCM structure for the individual Pd ALD cycles. Information about the Pd ALD growth mechanism can be elucidated from FIG. 7b. One reaction sequence for Pd ALD is given by:

(1)

(2)

In reaction 1, one Pd(hfac)$_2$ molecule reacts with the H-terminated Pd surface to liberate x Hhfac molecules and deposit a new layer of Pd on the surface that is now hfac-terminated. In reaction 2, the newly generated Pd-hfac surface reacts with HCOH. The HCOH decomposes to form H$_2$ and CO, and the H$_2$ reacts with Pd-hfac to release the remaining (2−x) hfac ligands and regenerate the starting surface. The number of hfac ligands released in each reaction is left variable, allowing for different possible stoichiometries. The actual stoichiometry for the surface reactions can be determined from the QCM data using the relationship: R=Δm/Δm$_2$ where Δm is the mass change following one complete Pd ALD cycle and Δm$_2$ is the mass change during reaction 1. From equations 2-3 and the atomic masses, Δm=M(Pd)=106 and mΔ$_2$=M(Pd)+ (2−x)M(hfac)−xM(H)=520−208x so that R=106/(520−208x). Because thickness is linearly related to mass on the QCM, R can be obtained from FIG. 7. Averaging over the 50 cycles shown in FIG. 7a, Δm=0.21 and Δm$_2$=0.60 so that R=0.35. Consequently, x=1.0 implying that one of the two hfac ligands is released from the surface during reaction 1.

The thickness of a Pd monolayer (ML) calculated from the bulk density of Pd is 2.45 Å. Therefore, the 0.21 Å/cycle Pd ALD growth rate derived from the QCM measurements is only ~0.1 ML. This slow growth rate results from the bulky hfac ligand remaining on the Pd surface following the Pd(hfac)$_2$ exposure blocking the adsorption of additional Pd(hfac)$_2$ molecules. Alternatively, adsorption may occur only at isolated sites such as Pd dimers on the surface, and the limited number of these discrete sites may limit the growth rate. Additional support for the mechanism given by reactions 1 and 2 is that the QCM signals obtained using H$_2$ as the reducing agent when depositing Pd ALD on a Pd surface are identical to those using HCOH. This finding indicates that the HCOH is merely acting as a hydrogen source, per reaction 2.

Figure 8:
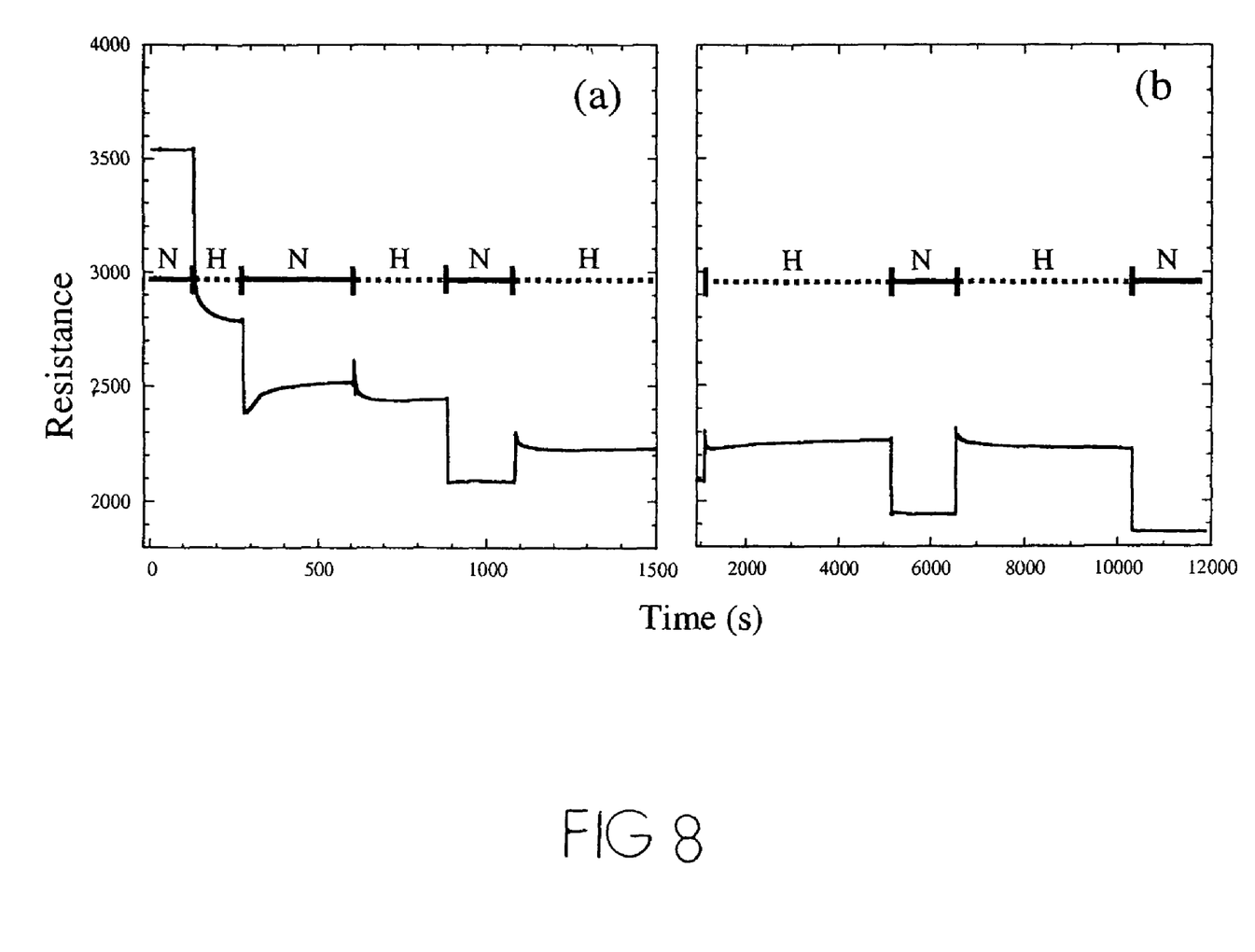
FIG. 8 is a graph showing electrical resistance of a membrane produced by the invented method, in accordance with features of the present invention.

The ALD Pd/AAO membranes show promise as a hydrogen sensors. FIG. 8 plots the resistance across the surface of the membrane versus time when exposed sequentially to 10%-vol H$_2$ in N$_2$ and pure N$_2$. Upon first exposing the sample to hydrogen (FIG. 8a), the resistance drops significantly and irreversibly. This resistance drop may result from enhanced inter-granular contact following volume expansion to form the Pd-hydride. Following the third exposure, the resistance changes become reproducible and stable (FIG. 8b). In this state, hydrogen exposure increases the resistance by about 20%. The time response for the Pd/AAO membrane is <1 s.

The invention enables atomic layer deposition of catalytic centers so as to provide production of same size clusters between 0.1 nm and 10 nm. Resulting surfaces exhibit a root mean squared roughness of 4.2 nm and deposit in the cubic phase. Resulting films are highly conductive with a resistivity of 14 micro ohms per centimeter. The invented technique deposits conformal films on the inside surfaces of foundation substrates.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

The embodiment of the invention in which an exclusive property or privilege is claimed is defined as follows:

1. A method for depositing catalytic clusters on a surface, the method comprising:
   a) confining the surface to a controlled atmosphere;
   b) contacting the surface with a catalyst containing vapor for a first predetermined period of time;
   c) removing the vapor from the controlled atmosphere; and
   d) contacting the surface with a reducing agent for a second predetermined period of time, producing catalyst-containing nucleation sites such that the surface defines a stippling of individual reaction centers rather than a continuous film.

2. The method as recited in claim 1 further comprising repeating steps a) through d) until the nucleation sites exhibit a predetermined target diameter.

3. The method as recited in claim 2 wherein the target diameter is between about 0.1 nanometers and 10 nanometers.

4. The method as recited in claim 1 wherein the controlled atmosphere comprises a gas which is inert to the catalyst-containing vapor.

5. The method as recited in claim 4 wherein the gas is nitrogen, argon, helium or combinations thereof.

6. The method as recited in claim 1 wherein the duration of said first and said second predetermined periods of time is directly proportional to the number of nucleation sites formed.

7. The method as recited in claim 1 wherein the surface has a surface area of between 10 m$^2$/gram and 1000 m$^2$/gram.

8. The method as recited in claim 1 wherein the surface contains hydroxyl moieties.

9. The method as recited in claim 1 wherein the surface contains oxides selected from the group consisting of Al$_2$O$_3$, TiO$_2$, SiO$_2$, Nb$_2$O$_5$, CuO, SrTiO$_2$, and combinations thereof.

10. The method as recited in claim 1 wherein the surface comprises metals.

11. The method as recited in claim 1 wherein the catalyst is a noble metal.

12. The method as recited in claim 1 wherein the catalyst is a metal selected from the group consisting of Pd, Pt, Rh, Ir, Ru, Re, Ag, Au, V, and combinations thereof.

13. The method as recited in claim 1 further comprising the steps of:
   e) contacting the surface with a second catalyst-containing vapor for a third pre-determined period of time;
   f) removing the vapor from the controlled atmosphere; and
   g) contacting the surface with a reducing agent for a fourth predetermined period of time so as to produce nucleation sites containing first and second catalyst.

14. The method as recited in claim 1 wherein the individual reaction centers are not in direct physical contact with each other.

15. The method as recited in claim 1 wherein the spaces between the clusters range from about 1 nm to 300 nm.

16. The method as recited in claim 1 wherein the clusters are arranged on the surface in a predetermined pattern.

17. A substrate, comprising
   at least one surface with a surface area between about 10 m$^2$/gram and 1000 m$^2$/gram; and a plurality of catalytic clusters of the same size deposited on the surface, the catalytic clusters deposited by a method comprising:
a) confining the substrate to a controlled atmosphere;
b) contacting the surface with catalyst containing vapor for a first predetermined period of time;
c) removing the vapor from the controlled atmosphere;
d) contacting the surface with a reducing agent for a second predetermined period of time so as to produce catalyst-containing nucleation sites;
e) contacting the surface with a second catalyst-containing vapor for a third predetermined period of time;
f) removing the vapor from the controlled atmosphere; and
g) contacting the surface with a reducing agent for a fourth predetermined period of time so as to produce nucleation sites containing first and second catalysts.

18. The substrate as recited in claim 17 wherein the clusters are between 0.5 and 50 nanometers in diameter.

19. The substrate as recited in claim 17 wherein the clusters are separated from each other at a distance selected from between 1 nm and 300 nm.

20. The substrate as recited in claim 17 wherein the clusters are comprised of low oxidation metals.

21. The substrate as recited in claim 17 wherein the clusters are comprised of low oxidation metals selected from the group consisting of Pd, Pt, Rh, Ir, Ru, Re, and combinations thereof.

22. The substrate as recited in claim 17 wherein the substrate comprises silicon.

23. The substrate as recited in claim 17 wherein the substrate comprises silicon overlaid with $Al_2O_3$.

* * * * *